(12) United States Patent
Heo et al.

(10) Patent No.: US 10,840,310 B2
(45) Date of Patent: Nov. 17, 2020

(54) DISPLAY DEVICE

(71) Applicant: Samsung Display Co., Ltd., Yongin-si (KR)

(72) Inventors: Ji Hye Heo, Asan-si (KR); Soon Jung Wang, Cheonan-si (KR); Eun Ju Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/296,259

(22) Filed: Mar. 8, 2019

(65) Prior Publication Data

US 2020/0027933 A1 Jan. 23, 2020

(30) Foreign Application Priority Data

Jul. 17, 2018 (KR) .................. 10-2018-0082807

(51) Int. Cl.
*H01L 29/04* (2006.01)
*H01L 31/036* (2006.01)
*H01L 27/32* (2006.01)
*H01L 51/52* (2006.01)
*H01L 51/50* (2006.01)

(52) U.S. Cl.
CPC ...... *H01L 27/3223* (2013.01); *H01L 27/3262* (2013.01); *H01L 51/5012* (2013.01); *H01L 51/525* (2013.01); *H01L 51/5256* (2013.01)

(58) Field of Classification Search
CPC ............ H01L 27/124; G02F 1/136286; G02F 1/13394; G02F 1/134363; G02F 1/1368
USPC ........................................... 257/72
See application file for complete search history.

(56) References Cited

U.S. PATENT DOCUMENTS

| 9,685,629 | B2 | 6/2017 | Park |
| 10,186,560 | B2 | 1/2019 | Lee et al. |
| 2007/0085475 | A1* | 4/2007 | Kuwabara ........... H01L 27/3262 313/506 |
| 2010/0244668 | A1* | 9/2010 | Nakamura .......... H01L 27/3223 313/504 |
| 2016/0183382 | A1 | 6/2016 | Solven et al. |
| 2019/0326359 | A1* | 10/2019 | Yang ...................... G06F 3/044 |

FOREIGN PATENT DOCUMENTS

| JP | 2010-140852 | 6/2010 |
| KR | 10-2012-0115021 | 10/2012 |
| KR | 10-2016-0104804 | 9/2016 |
| KR | 10-2016-0142810 | 12/2016 |
| KR | 10-2017-0104085 | 9/2017 |

* cited by examiner

*Primary Examiner* — David S Blum
(74) *Attorney, Agent, or Firm* — H.C. Park & Associates, PLC

(57) ABSTRACT

A display device includes a substrate having a display area and a non-display area located at an outer periphery of the display area; a transistor layer disposed on the substrate; a plurality of partition walls disposed on the transistor layer in the display area; a light emitting element disposed between the partition walls; and a spacer configured to be disposed in the non-display area of the substrate, wherein the spacer may include a spacer body disposed on the same layer as the partition walls and on at least a portion of the transistor layer.

25 Claims, 19 Drawing Sheets

DISPLAY DEVICE

CROSS-REFERENCE TO RELATED APPLICATION

This application claims priority from and the benefit of Korean Patent Application No. 10-2018-0082807, filed on Jul. 17, 2018, which is hereby incorporated by reference for all purposes as if fully set forth herein.

BACKGROUND

Field

Exemplary implementations of the invention relate to a display device, and more specifically, to a display device capable of preventing the display device from being damaged during a manufacturing process that uses a mask.

Discussion of the Background

A pixel of an organic light emitting diode (OLED) display includes two electrodes and an organic emission layer interposed therebetween, wherein electrons injected from a cathode, which is one of the two electrodes, and holes injected from an anode are combined in the organic emission layer to generate excitons, and the generated excitons release energy to emit light.

The organic emission layer of the OLED display may be formed by using a mask during a manufacturing process. However, the display device and the mask contact each other in a process of positioning the mask. This contact causes the display device to be damaged.

The above information disclosed in this Background section is only for understanding of the background of the inventive concepts, and, therefore, it may contain information that does not constitute prior art.

SUMMARY

Display devices constructed according to exemplary implementations of the invention are capable of preventing a display such as an organic light emitting diode from being damaged during a manufacturing process by minimizing the height difference between the partition wall spacers in the display area and the spacers in the non-display area and/or adjusting the density of the partition wall spacers in the display area relative to that of the spacers in the non-display area.

Additional features of the inventive concepts will be set forth in the description which follows, and in part will be apparent from the description, or may be learned by practice of the inventive concepts.

According to one aspect of the invention, a display device includes: a substrate having a display area and a non-display area located at an outer periphery of the display area; a transistor layer disposed on the substrate; a plurality of partition walls disposed on the transistor layer in the display area; a light emitting element disposed between the partition walls; and a spacer disposed in the non-display area of the substrate, wherein the spacer may include a spacer body disposed in the same layer as the partition walls, and on at least a portion of the transistor layer.

The transistor layer may include a source electrode and a drain electrode, and the spacer may include a dummy electrode disposed in the same layer as the source electrode and the drain electrode.

The transistor layer may further include a gate insulating layer, a first interlayer insulating layer, and a second interlayer insulating layer, and the spacer may include the gate insulating layer, the first interlayer insulating layer, and the second interlayer insulating layer.

The transistor layer may further include a coating layer coating the source electrode and the drain electrode, and the spacer may further include the coating layer disposed on the dummy electrode.

The transistor layer may include two or more data conductors disposed on different layers, and the spacer may include two or more data conductors disposed on different layers.

A plurality of partition wall spacers may be disposed on some of the plurality of partition walls.

Each of the plurality of partition walls and the plurality of partition wall spacers may be formed from same material and are connected to each other.

A ratio of the partition walls at which the partition wall spacers are disposed among all of the partition walls may be about 10% to about 20%.

A ratio of a height of the spacer to a sum of heights of the partition wall and the partition wall spacer may be about 0.7 to about 1.

The height of the spacer may be about 3 µm to about 6 µm.

The spacer may be disposed about 150 µm to about 200 µm apart from an edge of the display area.

The spacer body may include the same material as the partition wall.

The display device may further include a dam disposed in the non-display area, and the spacer may be disposed between the dam and the display area.

According to another aspect of the invention, a display device includes: a substrate having a display area and a non-display area located at an outer periphery of the display area; a transistor layer disposed on the substrate; a plurality of partition walls disposed on the transistor layer in the display area; a plurality of partition wall spacers disposed on some of the plurality of partition walls; a light emitting element disposed between the partition walls; and a spacer disposed in the non-display area of the substrate, wherein the spacers disposed in the non-display area may be arranged at a density higher than a density at which the partition wall spacers disposed in the display area are arranged.

A ratio of the partition walls at which the partition wall spacers are disposed among all the partition walls disposed in the display area may be about 10% to about 20%.

The arrangement density of the spacers disposed in the non-display area may be about 1.5 to about 3 times the arrangement density of the partition wall spacers disposed in the display area.

The partition wall and the partition wall spacer may include the same material, and may be connected to each other.

The spacer may include a spacer body disposed on the same layer as the partition wall, and at least a portion of the transistor layer.

The transistor layer may include a source electrode and a drain electrode, and the spacer may include a dummy electrode disposed in the same layer as the source electrode and the drain electrode.

The transistor layer may further include a gate insulating layer, a first interlayer insulating layer, and a second interlayer insulating layer, and the spacer may further include the gate insulating layer, the first interlayer insulating layer, and the second interlayer insulating layer.

The ratio of the height of the spacer to a sum of the heights of the partition wall and the partition wall spacer may be about 0.5 to about 1.

According to still another aspect of the invention, a display device includes: a substrate having a display area and a non-display area located at an outer periphery of the display area; a transistor layer disposed on the substrate; a plurality of partition walls disposed on the transistor layer in the display area; a plurality of partition wall spacers disposed on some of the plurality of partition walls; a light emitting element disposed between the partition walls; and a plurality of spacers disposed in the non-display area of the substrate, wherein the spacer may include a spacer body disposed on the same layer as the partition wall, and on at least a portion of the transistor layer, and the spacers are disposed in the non-display area at a higher density than a density at which the partition wall spacers are disposed in the display area.

The arrangement density of the spacers disposed in the non-display area may be about 1.5 to about 3 times the arrangement density of the partition wall spacers disposed in the display area.

The transistor layer may include a source electrode and a drain electrode, and the spacer may include a dummy electrode disposed on the same layer as the source electrode and the drain electrode.

The ratio of the height of the spacer to a sum of the heights of the partition wall and the partition wall spacer may be about 0.7 to about 1.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 4 is an image illustrating a plan view of a portion of the display area of the display device, FIG. 5 is a schematic, cross sectional view taken along line A-A' of FIG. 4, FIG. 6 is an image illustrating a plan view of a portion of the display and non-display area of the display device, and FIG. 7 is a schematic, cross sectional view taken along line B-B' of FIG. 4.

DETAILED DESCRIPTION OF THE EMBODIMENTS

Figure 1:
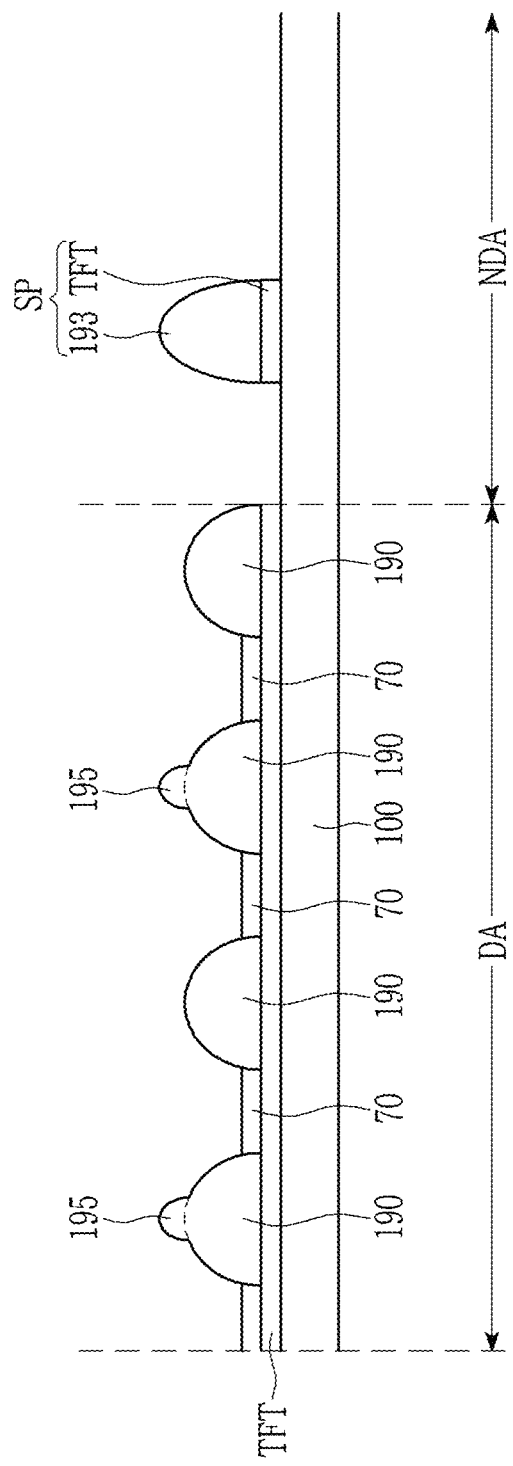
FIG. 1 is a schematic, cross-sectional view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Hereinafter, a display device according to exemplary embodiments of the invention will be described in detail with reference to the accompanying drawings.

FIG. 1 is a schematic, cross-sectional view of an exemplary embodiment of a display device constructed according to the principles of the invention. Referring to FIG. 1, a display device according to an exemplary embodiment includes a display area DA and a non-display area NDA. While the exemplary embodiments describe the display as being an organic light emitting diode (OLED) display for convenience, the principles of the invention may be applied to other types of display devices as would be recognized by those skilled in the art.

The display area DA includes a transistor layer TFT disposed on a substrate 100, a plurality of light emission elements, such as organic light emitting elements 70, disposed on the transistor layer TFT, and a partition wall 190. In FIG. 1, for better understanding and ease of description, the transistor layer TFT is simply shown as a single layer, but as is known in the art, the transistor layer TFT may be a multi-layer structure including a gate electrode, a semiconductor layer, a source electrode, a drain electrode, an insulating layer, etc. A specific exemplary structure of the transistor layer TFT will be described later with reference to FIG. 15, FIG. 20, and FIG. 21. Similarly, the organic light emitting element 70 of FIG. 1 includes a pixel electrode, an organic emission layer, and a common electrode. A specific exemplary structure of the organic light emitting element 70 will be described later with reference to FIG. 15, FIG. 20, and FIG. 21.

Referring to FIG. 1, the partition wall 190 is disposed between the plurality of organic light emitting elements 70. A partition wall spacer 195 is disposed at a part such as the top of the partition wall 190. The partition wall spacer 195 may be made of the same material as the partition wall, and may be formed by a single process by using a halftone mask or the like when the partition wall 190 is formed. That is, a part of the partition wall may project outwardly to form the partition wall spacer 195.

The partition wall spacer 195 contacts a mask used in a process of forming an organic emission layer of the organic light emitting element 70. That is, the partition wall spacer 195 prevents the partition wall 190 and the mask from directly contacting each other. When the partition wall 190 and the mask directly contact each other, a contact area therebetween is wide, thus the mask and the partition wall 190 are not easily separated, and respective layers including the partition wall 190 may be delaminated during a mask separation process. However, by disposing the partition wall spacer 195 at some of the partition walls 190 and directly contacting the partition wall spacer 195 and the mask, it is possible to reduce the contact area between the partition wall spacer 195 and the mask, thereby facilitating separation of the mask.

The partition wall spacer 195 is disposed only on some of a plurality of the partition walls 190. For example, the partition wall spacer 195 may be disposed only on one or two of ten partition walls. That is, an arrangement density of the partition wall spacer 195 in the display area DA may be 10% to 20%. In the illustrated exemplary embodiments, the arrangement density is a value obtained by dividing the number of partition walls having partition wall spacers 195 by the number of all partition walls.

Referring to FIG. 1, a spacer SP is disposed in the non-display area NDA. The spacer SP of the non-display area NDA contacts the mask in the same manner as the partition wall spacer 195 of the display area DA.

In some exemplary embodiments of the invention, the spacer SP includes at least a portion of the transistor layer TFT. That is, the spacer SP includes a spacer body 193 and a transistor layer TFT formed by the same process as that for the partition wall 190 in order that the height of the spacer SP generally matches the height of the partition wall spacer 195.

In a case of a comparative example, the spacer SP includes only the spacer body 193 formed by the same process as that for the partition wall 190. In this case, the transistor layer TFT is disposed on a lower portion of the partition wall 190, but the transistor layer TFT is not disposed on a lower portion of the spacer SP of the non-display area NDA. Accordingly, the height of the partition wall spacer 195 of the display area DA is different from that of the spacer SP of the non-display area NDA. In the illustrated exemplary embodiments, the height of the partition wall spacer 195 means the shortest distance between the furthest projecting portion of the partition wall spacer 195 and the substrate 100. Likewise, the height of the spacer SP means the shortest distance between the furthest projecting portion of the spacer SP and the substrate 100.

When the height of the partition wall spacer 195 of the display area DA and the height of the spacer SP of the non-display area NDA are different, the mask is not flatly disposed in a process of disposing the mask for forming the organic emission layer. Accordingly, stress is concentrated on the partition wall spacer 195 disposed at an edge of the display area DA. Due to the stress, the partition wall spacer 195 disposed at the edge of the display area DA is pressed or damaged. The damage to the partition wall spacer 195 may cause delamination of another layer disposed at a lower portion of the partition wall spacer 195.

However, referring to FIG. 1, the display device according to the exemplary embodiment, the spacer SP disposed in the non-display area NDA includes the spacer body 193 formed on the transistor layer TFT. That is, while an insulating layer, a data line, etc. are disposed on the lower portion of the spacer SP, the height difference between the partition wall spacer 195 of the display area DA and the spacer SP of the non-display area NDA is minimized. The spacer SP may include all the layers forming the transistor layer TFT disposed in the display area DA, or may include only some of the transistor layer TFT. For example, the spacer SP may include only the data line at the lower portion thereof. In addition, the spacer SP may include the data line and the insulating layer, and may include another conductive layer forming the display area, for example, a gate line or semiconductor layer. For example, when the display area DA includes two or more data conductors disposed in different layers, the spacer SP may also include two or more data conductors disposed in different layers. This may be appropriately selected by a skilled person in the art within a range that minimizes the height difference between the partition wall spacer 195 of the display area DA and the height of the spacer SP of the non-display area NDA.

For example, the height of the spacer SP of the non-display area NDA may be 70% to 100% of the height of the partition wall spacer 195 of the display area DA. The height of the spacer SP of the non-display area NDA may be about 3 μm to about 6 μm.

Figure 2:
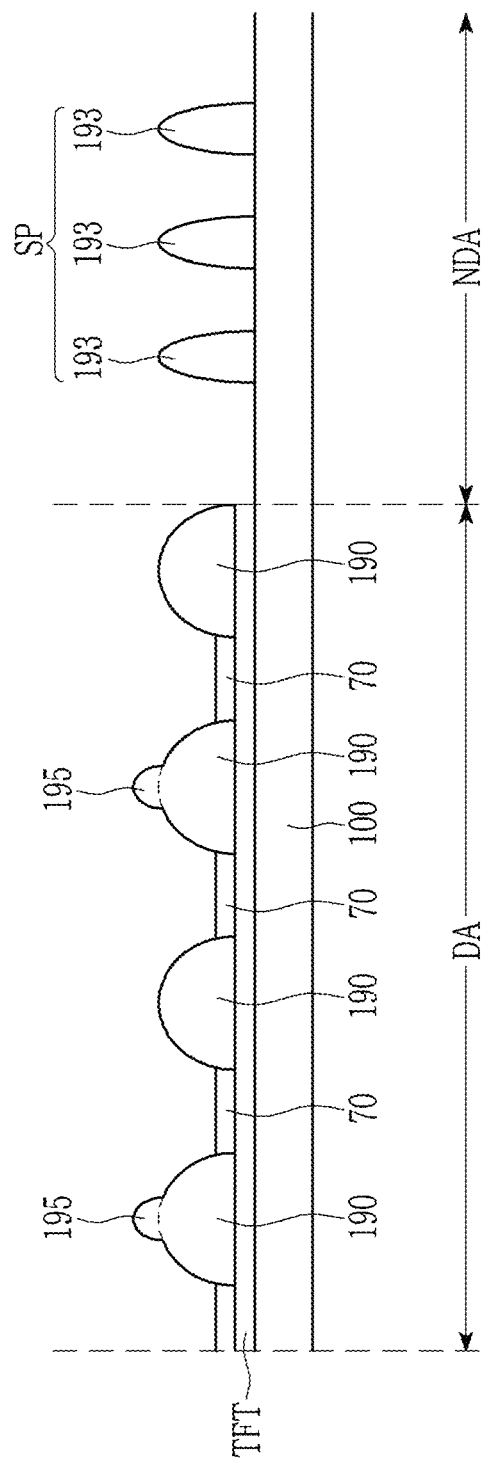
FIG. 2 is a schematic, cross-sectional view of another exemplary embodiment of a display device constructed according to the principles of the invention.

FIG. 2 is a schematic, cross-sectional view of another exemplary embodiment of a display device constructed according to the principles of the invention. Referring to FIG. 2, in the display device according to the exemplary embodiment of FIG. 2, the arrangement density of the partition wall spacers 195 of the display area DA and the arrangement density of the spacers SP of the non-display area NDA are different. That is, the density at which the spacers SP of the non-display area NDA are disposed is higher than the density at which the partition wall spacers 195 of the display area DA are disposed. The arrangement density of the spacers SP of the non-display area NDA is defined in the same manner as that of the display area DA. That is, the arrangement density of the spacers SP of the non-display area NDA is defined as a ratio of a unit area where the spacers SP are formed in a total area of the non-display area NDA. Herein, the unit area may be an area corresponding to one light emitting area of the display area DA.

For example, the arrangement density of the spacers SP of the non-display area NDA may be 1.5 times to 3 times the arrangement density of the partition wall spacers 195 of the display area DA.

In the exemplary embodiment of FIG. 2, the spacer SP does not include the transistor layer TFT. The spacer SP includes only the spacer body 193, such that the height of the spacer SP of the non-display area NDA and the height of the partition wall spacer 195 of the display area DA are different.

For example, the height of the spacer SP of the non-display area NDA may be 50% to 100% of the height of the partition wall spacer 195 of the display area DA.

However, in the display device according to the illustrated exemplary embodiment, stress occurring when the mask is applied thereto is dispersed by the spacers SP disposed in the non-display area NDA in a configuration having a high arrangement density. Therefore, it is possible to minimize or prevent the partition wall spacer 195 disposed at the edge of the non-display area NDA from being damaged.

Figure 3:
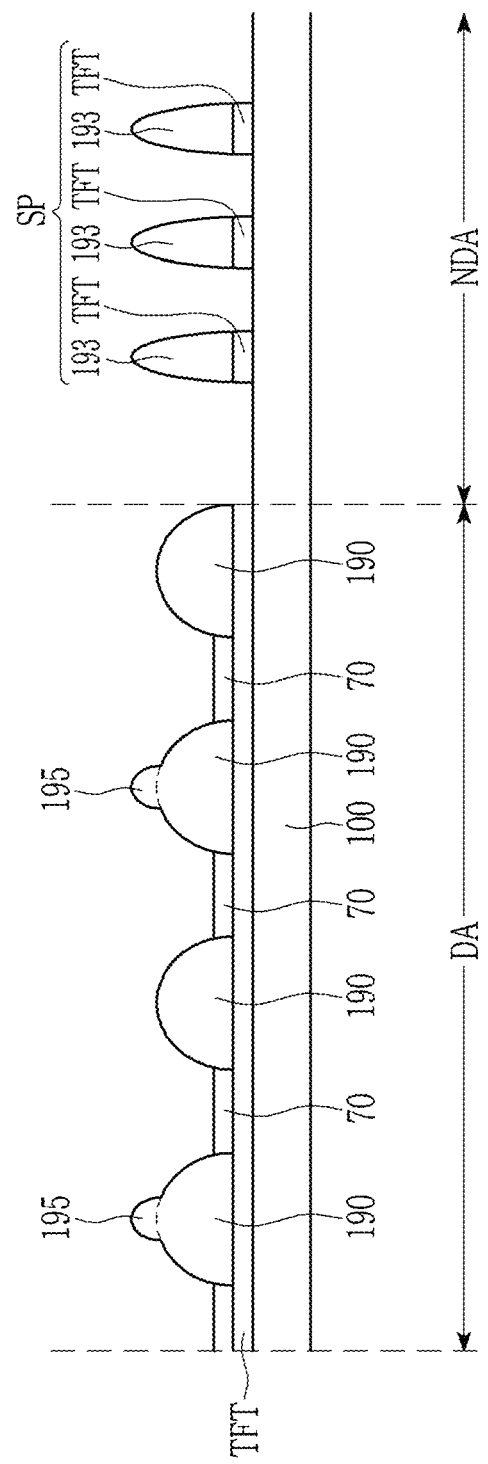
FIG. 3 is a schematic, cross-sectional view of still another exemplary embodiment of a display device constructed according to the principles of the invention.

FIG. 3 is a schematic, cross-sectional view of still another exemplary embodiment of a display device constructed according to the principles of the invention. Referring to FIG. 3, the display device according to the illustrated exemplary embodiment includes features according to the exemplary embodiment of FIG. 1 and features according to the exemplary embodiment of FIG. 2. That is, in the display device according to the exemplary embodiment of FIG. 3, the spacer SP of the non-display area NDA includes the transistor layer TFT at a lower portion thereof, and has a higher arrangement density than that of the partition wall spacer 195 of the display area DA. In this case, since the height of the spacer SP of the non-display area NDA and the height of the partition wall spacer 195 of the display area DA are similar to each other, when the mask is applied, it is possible to minimize stress applied to the partition wall spacer 195 disposed at the edge of the display area DA. In addition, since the spacers SP of the non-display area NDA are disposed at a higher arrangement density than the partition wall spacers 195 of the display area DA, stress applied to the partition wall spacers 195 of the display area DA is dispersed. Therefore, it is possible to effectively prevent damage to the partition wall spacers 195 by the mask.

Figure 4:
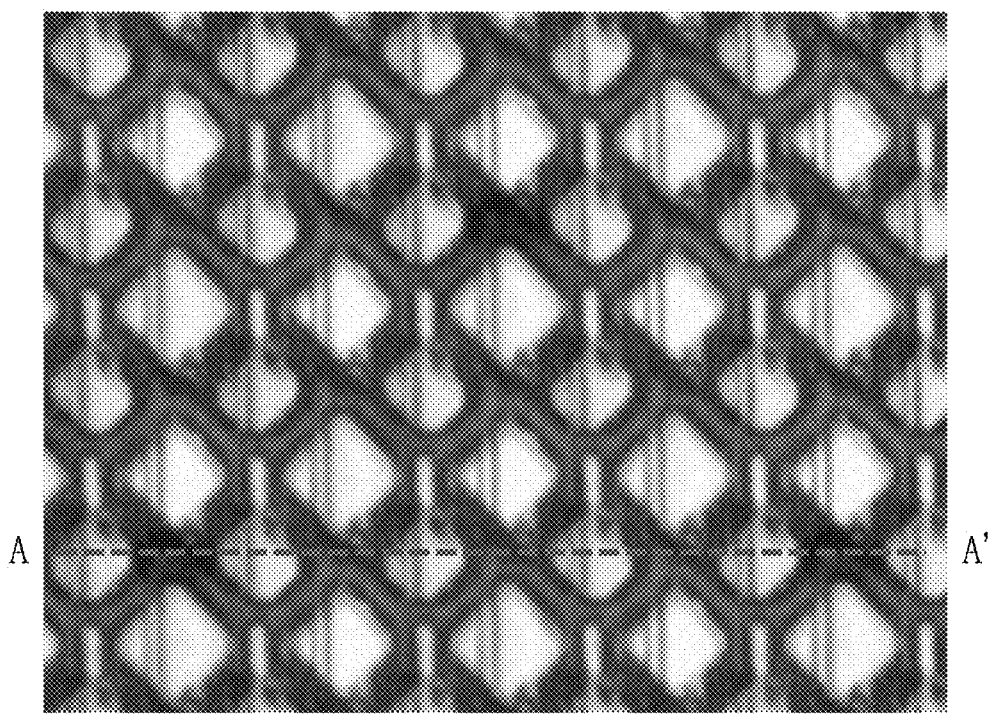
FIG. 4 to FIG. 7 are images and cross section views showing how a partition wall spacer is damaged when a mask is positioned in a display device according to a comparative example. Specifically.
Figure 5:
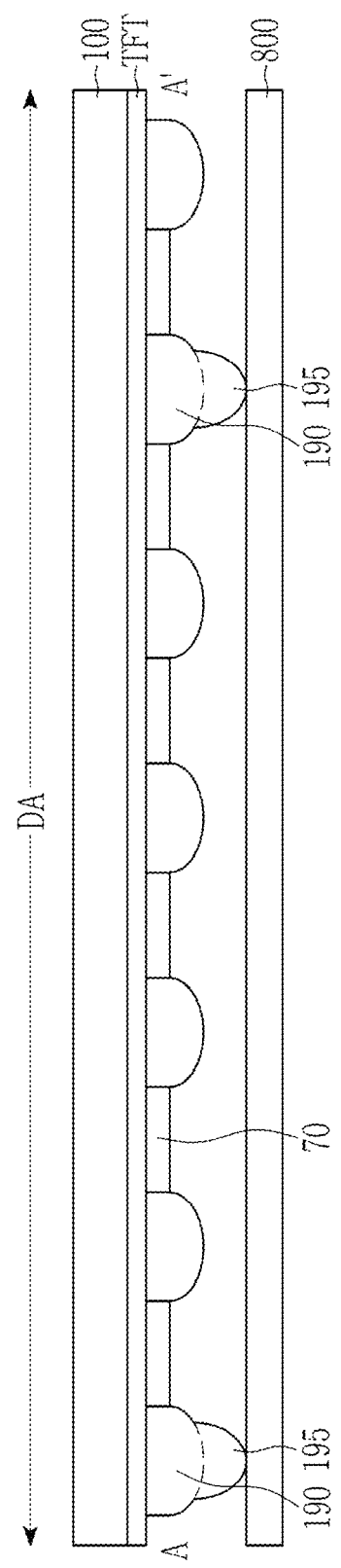
Figure 6:
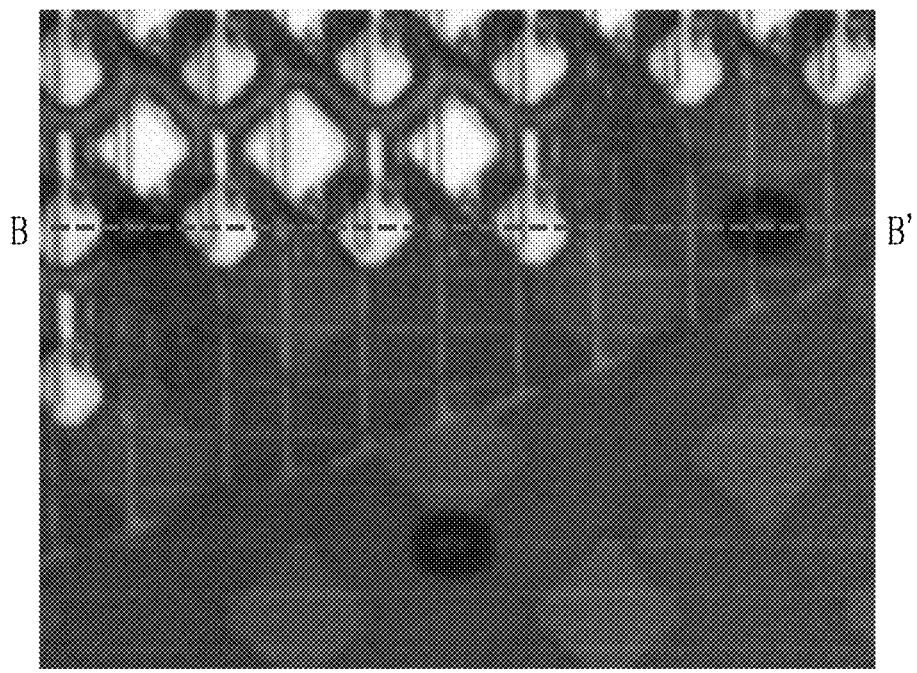
Figure 7:
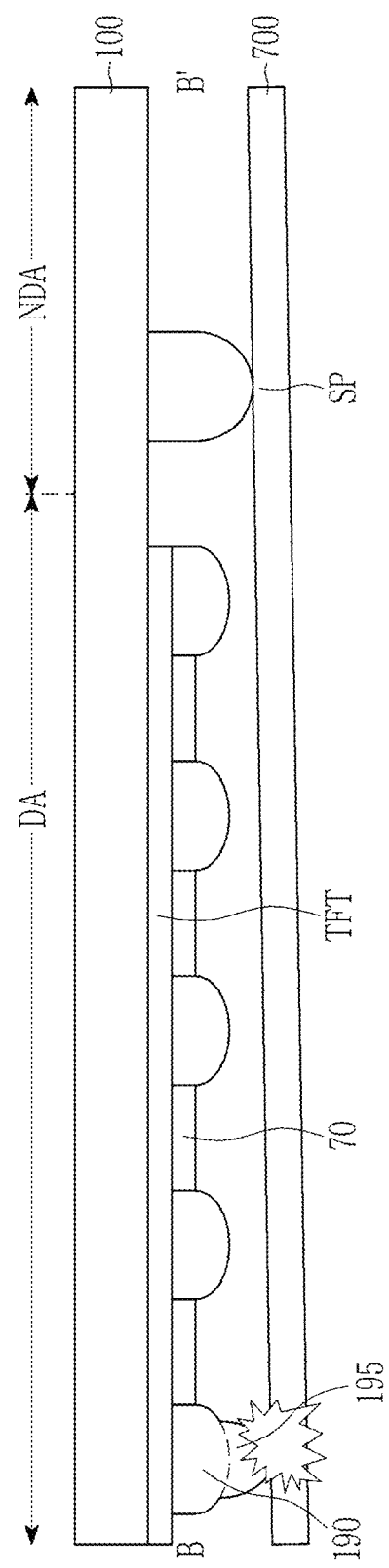

FIG. 4 to FIG. 7 are images and cross-section views showing how a partition wall spacer 195 is damaged when a mask is positioned in a display device according to a comparative example. Specifically, FIG. 4 is an image illustrating a plan view of a portion of the display area of the display device, FIG. 5 is a schematic, cross sectional view taken along line A-A' of FIG. 4, FIG. 6 is an image illustrating a plan view of a portion of the display and non-display area of the display device, and FIG. 7 is a schematic, cross sectional view taken along line B-B' of FIG. 4.

FIG. 4 illustrates an image of the display area of the display device, and FIG. 5 illustrates a cross-sectional view of a portion indicated by a dotted line in FIG. 4. Referring to FIG. 5, the partition wall spacer 195 is disposed at a part of the partition wall 190 in the display area DA. Since the heights of the partition wall spacers 195 are substantially the same in the display area DA, a mask 800 is stably disposed.

FIG. 6 illustrates an image in which both of the display area and the non-display area of the display device are shown. In FIG. 6, a portion indicated by a bright rhombus is the display area, and a portion indicated by a dark rhombus is the non-display area. In FIG. 6, the spacer is shown as a black circle. FIG. 7 illustrates a cross-sectional view of a portion indicated by a dotted line in FIG. 6.

Referring to FIG. 7, the height of the spacer SP of the non-display area NDA is lower than that of the partition wall spacer 195 of the display area DA. This is because the structure of a transistor layer such as the data line is not disposed under the non-display area NDA. Therefore, as shown in FIG. 7, the mask 800 is obliquely angled. In this case, stress is concentrated on a boundary between the display area DA and the non-display area NDA, that is, on the partition wall spacer 195 disposed at the edge of the display area DA. Therefore, the partition wall spacer 195 is stressed by the pressure and is damaged.

Figure 8:
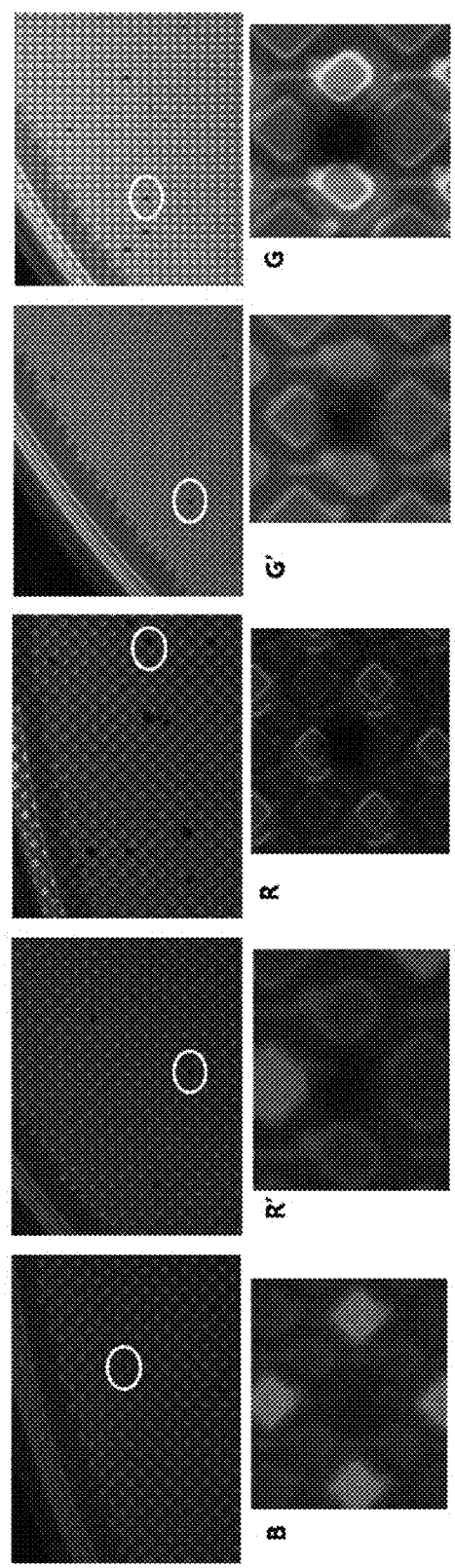
FIG. 8 are images of a partition wall spacer that is actually damaged.

FIG. 8 illustrates images of a partition wall spacer 195 that is actually damaged. Referring to FIG. 8, it can be seen that the damaged partition wall spacer appears dark. When the partition wall spacer 195 is damaged, there is a high possibility that another layer under the partition wall spacer 195 is delaminated. Therefore, as shown in FIG. 8, it is viewed as a dark spot, which causes a failure of the display device. The damage of the partition wall spacer 195 mainly appears at an edge of the display area DA, i.e., a portion adjacent to the non-display area NDA, as can be seen in FIG. 8. This is because the stress due to the height difference between the partition wall spacer 195 of the display area DA and the height of the spacer SP of the non-display area NDA is concentrated on the edge of the display area DA.

However, in the display device according to the exemplary embodiment as shown in FIG. 1, the spacer SP of the non-display area NDA includes at least a portion of the transistor layer TFT at the lower portion thereof, and therefore the heights of the spacer SP and the partition wall spacer 195 of the non-display area NDA are similar. Therefore, the stress due to the height difference between the partition wall spacer 195 and the spacer SP does not occur, so that the damage to the partition wall spacers 195 and the delamination of the lower layers may be prevented in the display area DA.

Figure 9:
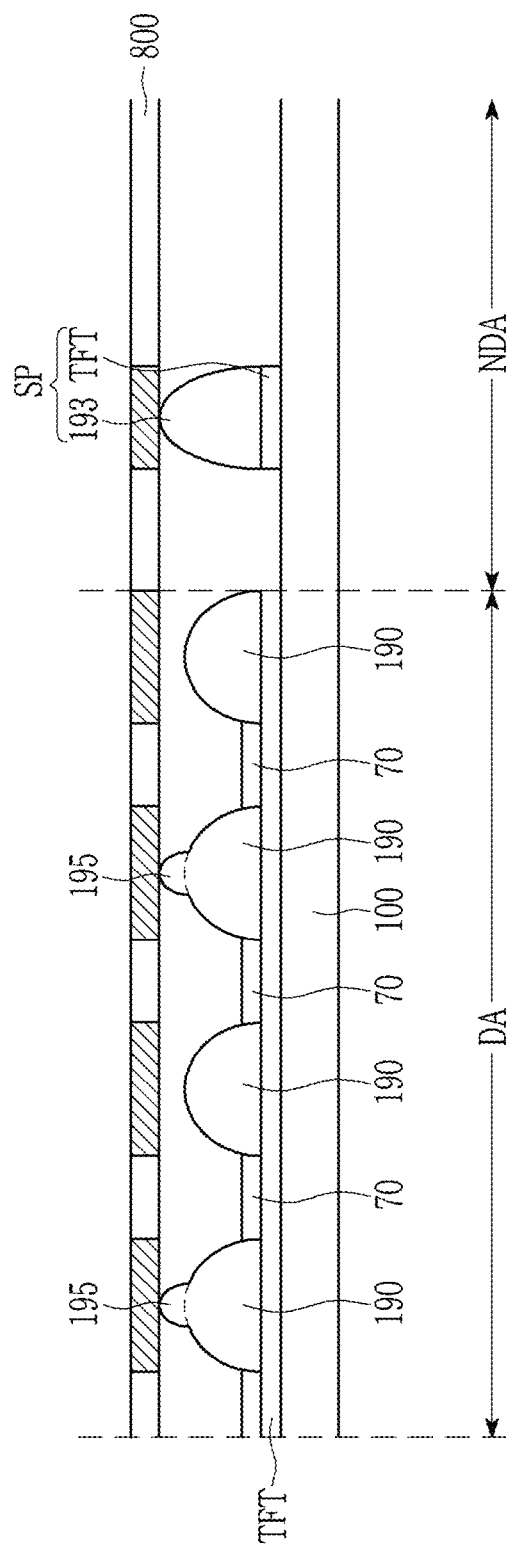
FIG. 9 is a cross-sectional view of a structure in which a mask is disposed in the display device according to the exemplary embodiment of FIG. 1.

FIG. 9 is a cross-sectional view of a structure in which a mask 800 is disposed in the display device according to the exemplary embodiment of FIG. 1. Referring to FIG. 9, since the height of the partition wall spacer 195 and the height of the spacer SP of the non-display area NDA are similar, the stress due to the mask 800 is not concentrated on any one point. Therefore, it is possible to prevent the partition wall spacer 195 from being damaged.

Figure 10:
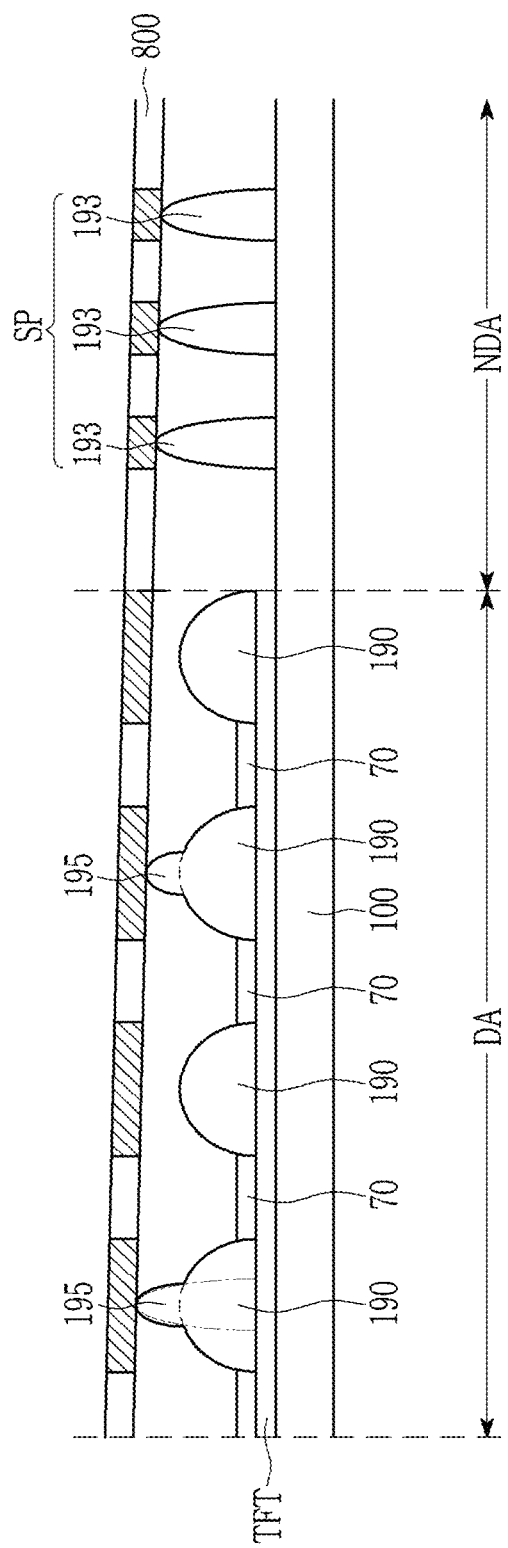
FIG. 10 is a cross-sectional view of a structure in which a mask is disposed in the display device according to the exemplary embodiment of FIG. 2.

FIG. 10 is a cross-sectional view of a structure in which a mask 800 is disposed in the display device according to the exemplary embodiment of FIG. 2. Referring to FIG. 10, in the illustrated exemplary embodiment, the height of the partition wall spacer 195 and the height of the spacer SP are different. Herein, the stress due to the height difference between the partition wall spacer 195 and the spacer SP is dispersed because the spacers SP are densely disposed in the non-display area NDA with a high arrangement density. Therefore, the stress is not concentrated on the partition wall spacer 195, thereby reducing or preventing the damage.

Figure 11:
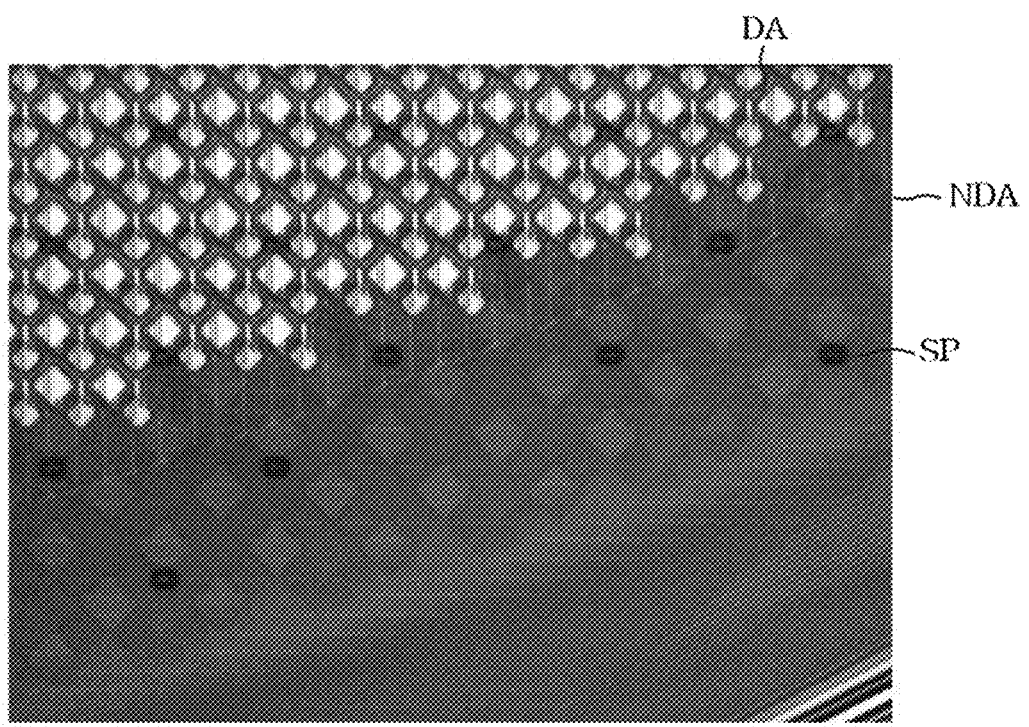
FIG. 11 is an image of a display device according to a comparative example.
Figure 12:
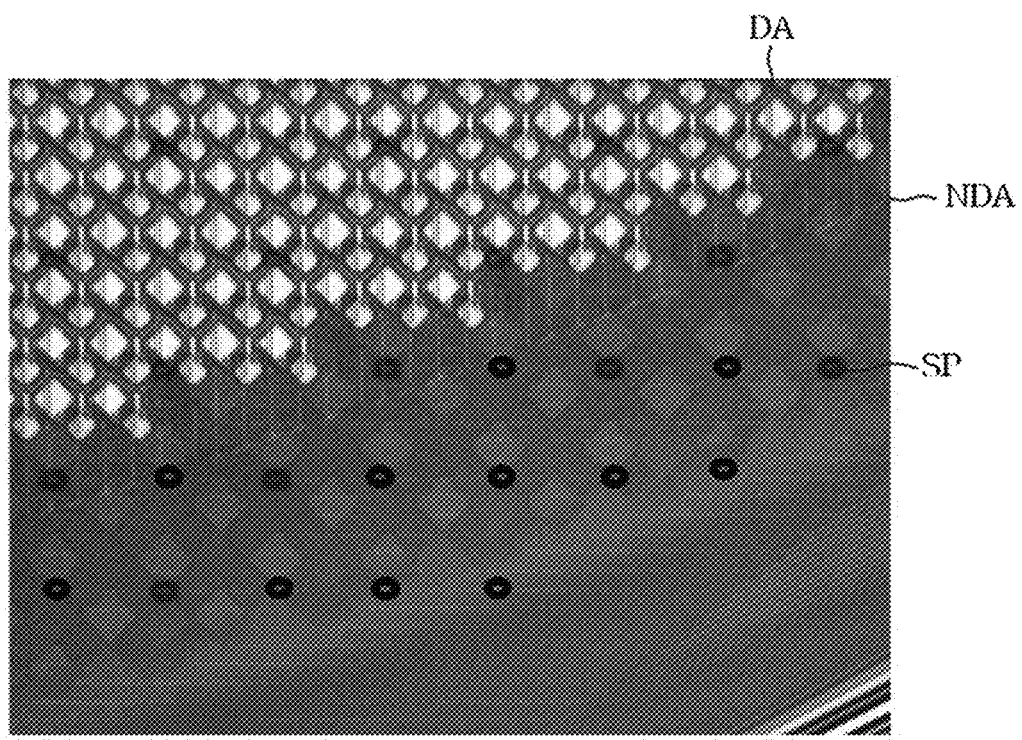
FIG. 12 is an image of a display device according to the exemplary embodiment of FIG. 2.

FIG. 11 illustrates an image of a display device according to a comparative example, and FIG. 12 illustrates an image of a display device according to the exemplary embodiment of FIG. 2. Comparing FIG. 11 with FIG. 12, FIG. 12 shows that the spacers SP are disposed at a high arrangement density in the non-display area NDA as compared with FIG. 11. As described above, when the arrangement density of the spacers SP in the non-display area is increased, since the stress is dispersed, it is possible to reduce or prevent the partition wall spacer 195 of the display area DA from being damaged.

Figure 13:
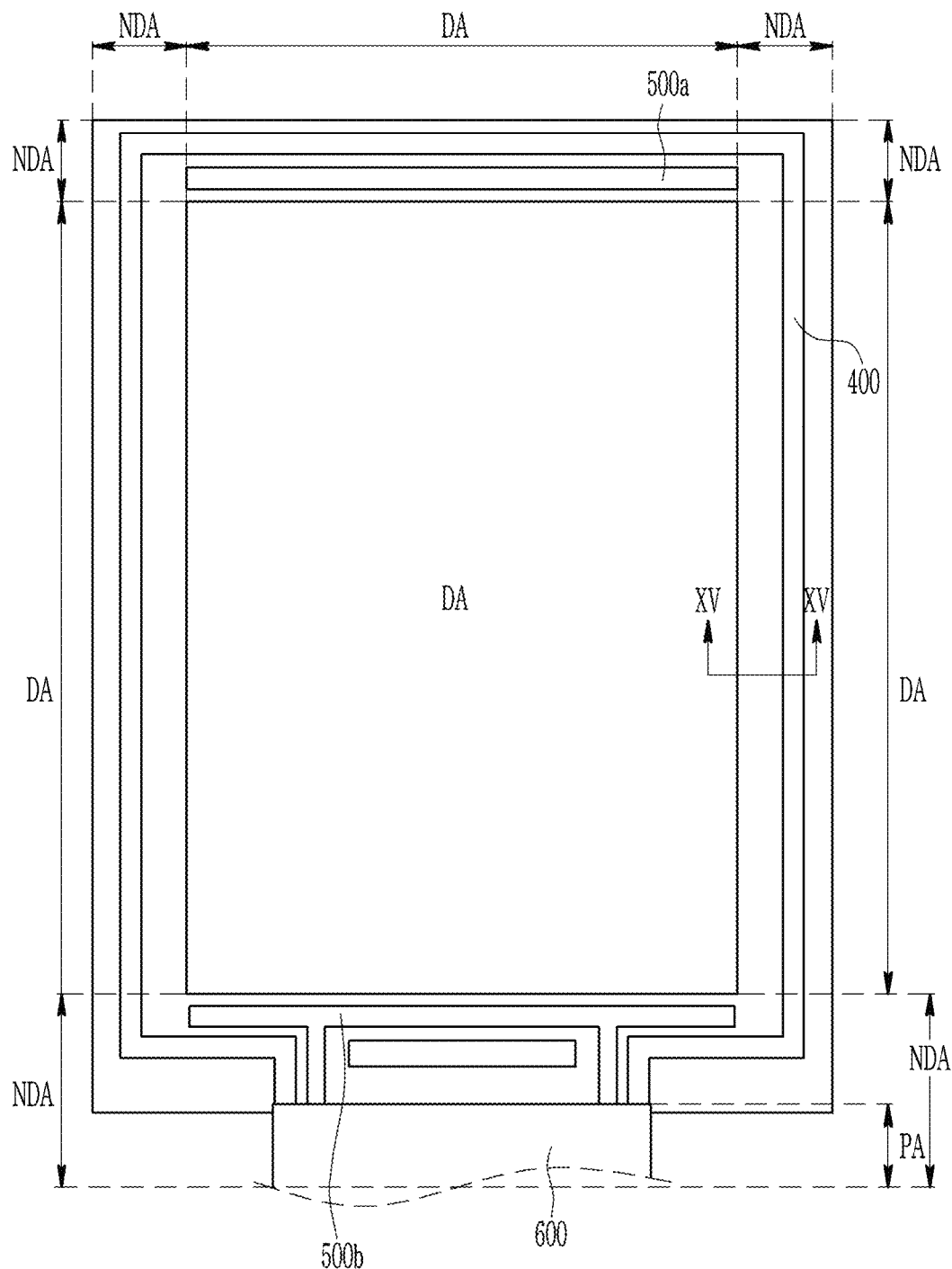
FIG. 13 is a top plan view of a display device according to an exemplary embodiment.
Figure 14:
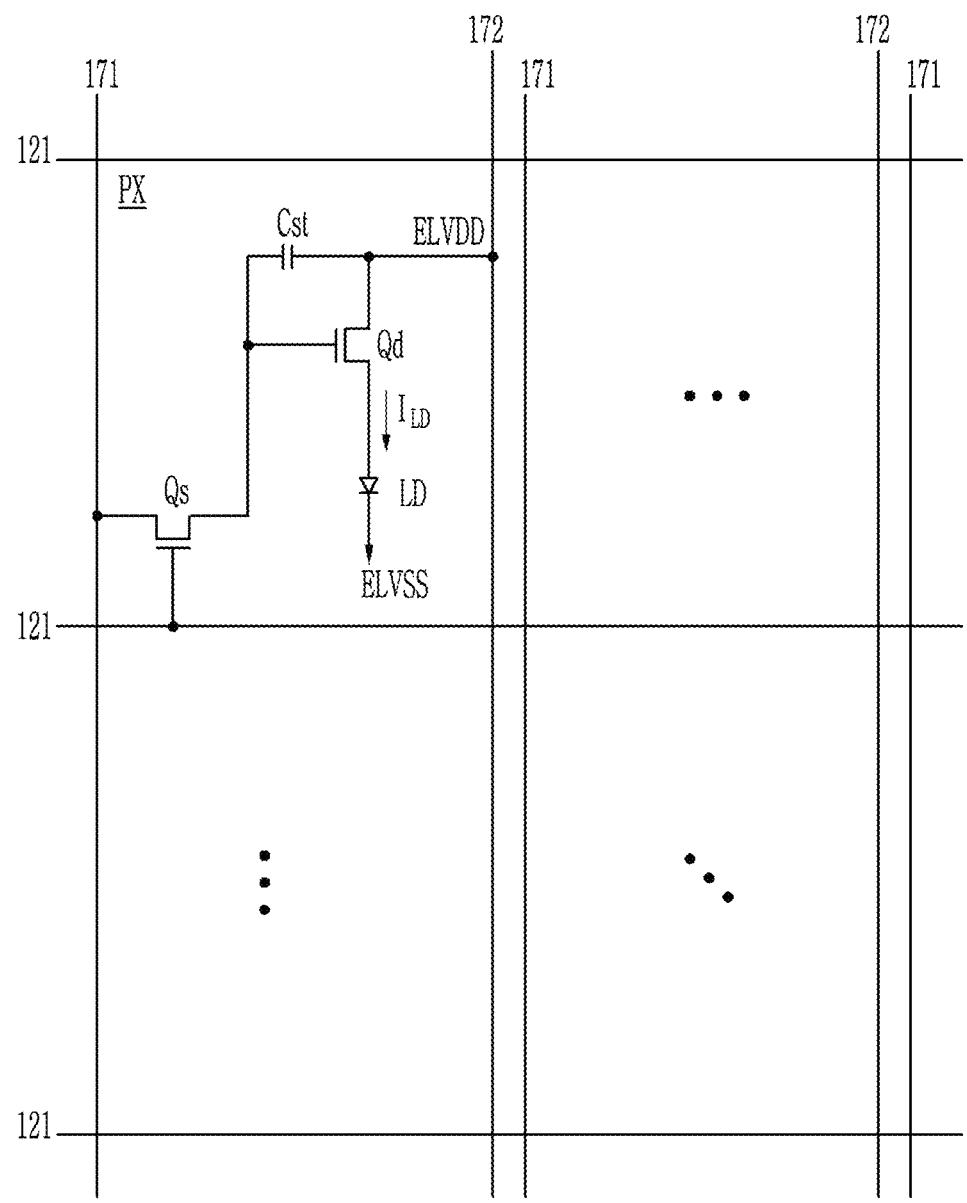
FIG. 14 is an equivalent circuit diagram of one representative pixel of a display device according to an exemplary embodiment.
Figure 15:
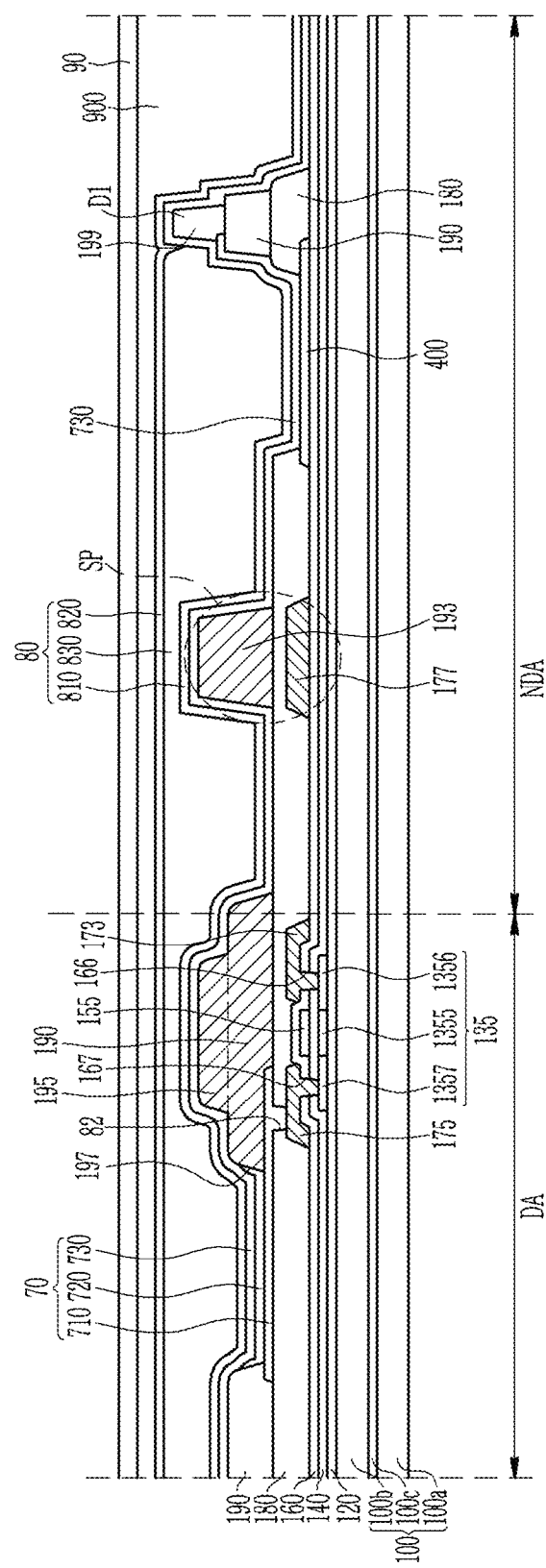
FIG. 15 is a schematic, cross-sectional view taken along line XV-XV of FIG. 13.

Hereinafter, a specific structure of a display device according to an exemplary embodiment will be described with reference to FIG. 13 to FIG. 15. FIG. 13 illustrates a top plan view of a display device according to an exemplary embodiment, and FIG. 14 illustrates an equivalent circuit diagram of one representative pixel of a display device according to an exemplary embodiment. FIG. 15 is a schematic, cross-sectional view taken along line XV-XV of FIG. 13.

Referring to FIG. 13, the display device according to the illustrated exemplary embodiment includes the display area DA for displaying an image and the non-display area NDA located at an outer periphery of the display area.

The non-display area NDA includes a driving area PA in which a driver 600 for transmitting a signal to the display area DA is disposed. A common voltage transmitting line 400 for transmitting a common voltage and driving voltage transmitting lines 500a and 500b for transmitting a driving voltage are disposed in the non-display area NDA. However, an arrangement of the common voltage transmitting line 400 the driving voltage transmitting lines 500a and 500b shown in FIG. 13 is an example, but the invention is not limited thereto.

Structures of the display area DA and the non-display area NDA will be described with reference to FIG. 14 and FIG. 15.

Referring to FIG. 14, the display area DA of the display device according to the exemplary embodiment includes a plurality of signal lines 121, 171, and 172, and a plurality of pixels that are connected to the plurality of signal lines 121, 171, and 172 and arranged in an approximate matrix form. The representative pixel PX is referred to as an area partitioned by the plurality of signal lines 121, 171, and 172 in FIG. 15, and is a minimum unit for displaying an image. The display device displays an image by using a plurality of pixels.

The signal line includes a plurality of gate lines 121 for transmitting a gate signal (or a scan signal), a plurality of data lines 171 for transmitting a data signal, and a plurality of driving voltage lines 172 for transmitting a driving voltage ELVDD. The data line 171, the driving voltage line 172, the data conductor, and the gate line 121 will be referred to as gate conductors.

The gate lines 121 substantially extend in a row direction and are substantially parallel to each other, and parts of the data lines 171 and the driving voltage lines 172 substantially extend in a column direction and are substantially parallel to each other.

The pixel PX includes a switching thin film transistor Qs, a driving thin film transistor Qd, a storage capacitor Cst, and an organic light emitting diode (OLED) LD. One pixel PX may further include a thin film transistor and a capacitor to compensate a current that is supplied to the organic light emitting diode LD.

The switching thin film transistor Qs responds to the scan signal applied to the gate line 121 to transmit the data signal applied to the data line 171 to the driving thin film transistor Qd. The driving thin film transistor Qd outputs an output current $I_{LD}$ that is variable according to a voltage applied between the control terminal and the output terminal. The capacitor Cst charges the data signal applied to the control terminal of the driving thin film transistor Qd and maintains it when the switching thin film transistor Qs is turned off.

The organic light emitting diode LD includes an anode connected to the output terminal of the driving thin film transistor Qd and a cathode connected to a common voltage ELVSS. The organic light emitting diode LD changes intensity and emits light depending on the output current $I_{LD}$ of the driving thin film transistor Qd to thus display the image.

Now, an inter-layer structure of the display device will be described with reference to FIG. 15.

As described above, the display device includes the display area DA and the non-display area NDA.

The display device includes the substrate 100, and the substrate 100 is flexible and may include a first insulating layer 100a and a second insulating layer 100b overlapping each other. The first insulating layer 100a and the second insulating layer 100b may include a polyimide. However, the first insulating layer 100a and the second insulating layer 100b are not limited thereto, and may include other materials that are heat resistant, chemical resistant, abrasion resistant, and flexible.

The substrate 100 may further include a first barrier film 100c disposed between the first insulating layer 100a and the second insulating layer 100b. The first barrier film 100c prevents external moisture and gas from flowing in between the first insulating layer 100a and the second insulating layer 100b, and prevents deformation of the first insulating layer 100a and the second insulating layer 100b.

The substrate 100 includes the first insulating layer 100a and the second insulating layer 100b overlapping each other, thus it is possible to prevent the substrate 100 from deteriorating even if the first insulating layer 100a in contact with the outside is damaged. However, the structure of the substrate 100 is merely an example, and the substrate 100 may be a single layer including a flexible material.

A buffer layer 120 is disposed on the substrate 100. The buffer layer 120 may include a single layer or a multi-layer of a silicon nitride (SiNx) and a silicon oxide (SiOx), and prevents penetration of unnecessary components such as impurities or moisture.

A second barrier film may be disposed between the second insulating layer 100b and the buffer layer 120.

A first semiconductor layer 135 is disposed on the buffer layer 120 of the display area DA. The first semiconductor layer 135 may include a polysilicon or oxide semiconductor.

The first semiconductor layer 135 includes a first channel region 1355, and a first source region 1356 and a first drain region 1357 disposed at respective sides of the first channel region 1355. The first channel region 1355 of the first semiconductor layer 135 may be a region in which an impurity is not doped, and the first source region 1356 and the first drain region 1357 of the first semiconductor layer 135 may be regions in which a conductive impurity is doped.

A gate insulating layer 140 is disposed on the first semiconductor layer 135. The gate insulating layer 140 may be a single layer including tetraethyl orthosilicate (TEOS), a silicon oxide ($SiO_x$), a silicon nitride ($SiN_x$), or a silicon oxynitride (SiON), or a multi-layer thereof.

A first gate electrode 155 is disposed on the gate insulating layer 140. The first gate electrode 155 overlaps the first channel region 1355.

The first gate electrode 155 may be the single layer or the multi-layer, including a low resistance material such as aluminum (Al), titanium (Ti), molybdenum (Mo), copper (Cu), nickel (Ni), or alloys thereof, or a material having strong resistance to corrosion.

A first interlayer insulating layer 160 is disposed on the first gate electrode 155. The first interlayer insulating layer 160 may be the single layer including tetraethyl orthosilicate (TEOS), a silicon oxide ($SiO_x$), a silicon nitride ($SiN_x$), or a silicon oxynitride (SiON), or a multi-layer thereof.

The first interlayer insulating layer 160 and the gate insulating layer 140 have a first source contact hole 166 and a first drain contact hole 167 overlapping the first source region 1356 and the first drain region 1357, respectively.

A first source electrode 173 and a first drain electrode 175 are disposed on the first interlayer insulating layer 160. In addition, a dummy electrode 177 is disposed on the first interlayer insulating layer 160 of the non-display area NDA. The dummy electrode 177 may be formed in the same process as that for the first source electrode 173 and the first drain electrode 175, and may have the same thickness as the first source electrode 173 and the first drain electrode 175. In addition, the common voltage transmitting line 400 is disposed on the first interlayer insulating layer 160 of the non-display area NDA. The dummy electrode 177 may be disposed between the display area DA and the common voltage transmitting line 400.

The dummy electrode 177 may be disposed 150 µm to 200 µm apart from the edge of the display area DA.

The first source electrode 173 and the first drain electrode 175 are connected to the first source region 1356 and the first drain region 1357 of the first semiconductor layer 135 through the first source contact hole 166 and the first drain contact hole 167.

The first source electrode 173 and the first drain electrode 175 may be made of the single layer or the multi-layers including a low resistance material or a strongly corrosion-resistant material such as aluminum (Al), titanium (Ti), molybdenum (Mo), copper (Cu), nickel (Ni), or alloys thereof. The dummy electrode 177 and the common voltage transmitting line 400 may be simultaneously formed with the same layer as the first source electrode 173 and the first drain electrode 175.

The first semiconductor layer 135, the first gate electrode 155, the first source electrode 173, and the first drain electrode 175 of the display area DA form the driving thin film transistor Qd of the pixel PX shown in FIG. 14. In addition, the thin film transistor included in the gate driver or the like may be disposed in the non-display area NDA.

A second interlayer insulating layer 180 is disposed on the first source electrode 173 and the first drain electrode 175. Like the first interlayer insulating layer 160, the second interlayer insulating layer 180 may be the single layer including tetraethyl orthosilicate (TEOS), a silicon oxide ($SiO_x$), a silicon nitride ($SiN_x$), or a silicon oxynitride (SiON), or a multi-layer thereof.

The second interlayer insulating layer 180 is provided with a contact hole 82 overlapping the first drain electrode 175. The second interlayer insulating layer 180 is removed at a region overlapping the common voltage transmitting line 400 such that most of the common voltage transmitting line 400 does not overlap the second interlayer insulating layer 180, and only a part of an edge of the common voltage transmitting line 400 may overlap the second interlayer insulating layer 180. However, all of the common voltage transmitting line 400 may not overlap the second interlayer insulating layer 180.

A pixel electrode 710 is disposed on the second interlayer insulating layer 180. The pixel electrode 710 may be an anode of an organic light emitting diode of FIG. 14. In the illustrated exemplary embodiment, the second interlayer insulating layer 180 is disposed between the pixel electrode 710 and the first drain electrode 175, however it may be disposed on the same layer as the pixel electrode 710 and the first drain electrode 175 and may be integrated with the first drain electrode 175.

A partition wall 190 is formed on the pixel electrode 710. The partition wall 190 is provided with an opening 197 overlapping the pixel electrode 710. The partition wall 190 may include a polyacrylate resin, a polyimide resin, a silica-based inorganic material, etc. A part of the partition wall 190 upwardly protrudes to form the partition wall spacer 195. A description of the partition wall spacer 195 is substantially the same as described above. A detailed description of the same constituent elements will be omitted to avoid redundancy. That is, the partition wall spacer 195 may be formed in the same process as that for the partition wall 190, and may have a height projecting further than the partition wall 190 by using a halftone mask and the like. The partition wall spacer 195 is formed on a part of the partition wall 190, thus it is possible to reduce or prevent the partition wall 190 from being damaged while the mask is positioned.

The spacer body 193 formed by the same process as that for the partition wall 190 is disposed in the non-display area NDA. The spacer body 193 is formed by the same process as that for the partition wall 190, thus it may include the same material as the partition wall 190. A thickness (i.e., a height) of the spacer body 193 may be the same as a sum of thicknesses (i.e., a height) of the partition wall 190 and the partition wall spacer 195.

The spacer body 193 may be disposed to overlap the dummy electrode 177. As can be seen in FIG. 15, the spacer body 193, the dummy electrode 177, the second interlayer insulating layer 180, the first interlayer insulating layer 160, the gate insulating layer 140, the buffer layer 120, and the like may form the spacer SP.

Since the spacer SP includes the dummy electrode 177 at the lower portion thereof, it has a similar height to the partition wall spacer 195 of the display area DA. That is, since the dummy electrode 177 corresponding to the first source electrode 173 and the first drain electrode 175 that are disposed under the partition wall spacer 195 of the display area DA is disposed under the spacer SP, it is possible to minimize the height difference between the partition wall spacer 195 of the display area DA and the spacer SP of the non-display area NDA.

The spacer SP may be disposed between the display area DA and the common voltage transmitting line 400. The spacer SP may be disposed about 150 µm to about 200 µm apart from the edge of the display area.

An organic emission layer 720 is disposed in the opening 197 of the partition wall 190.

The organic emission layer 720 may be made of multiple layers including an emission layer and one or more among a hole-injection layer (HIL), a hole-transporting layer (HTL), an electron-transporting layer (ETL), and an electron-injection layer (EIL). In the case where the organic emission layer 720 includes all the layers, the hole-injection layer is disposed on the pixel electrode 710 which is an anode, and the hole-transporting layer, the emission layer, the electron-transporting layer, and the electron-injection layer may be sequentially stacked thereon.

A common electrode 730 is disposed on the partition wall 190 and the organic emission layer 720. The common electrode 730 may be a cathode of the organic light emitting element. Accordingly, the pixel electrode 710, the organic emission layer 720, and the common electrode 730 form an organic light emitting element 70.

The organic light emitting diode display may have any one structure among a top display type, a rear display type, and a both-sides display type according to the direction in which the organic light emitting element 70 emits light.

The common electrode 730 may be disposed on the entire surface of the substrate 100 including the display area DA and the non-display area NDA, and contacts the common voltage transmitting line 400 of the non-display area NDA to receive the common voltage.

A dam D1 is disposed outside the common voltage transmitting line 400 of the non-display area NDA. The dam D1 may be formed of an insulating layer formed of the same layer as the second interlayer insulating layer 180 and the partition wall 190 disposed in the display area DA, and an additional insulating layer 199. The dam D1 may have a high height by the additional insulating layer 199, which may prevent an organic material from flowing during a process of forming an organic encapsulation layer and the like. The dam D1 is disposed farther from the display area DA than the spacer SP, and the height of the dam D1 may be higher than that of the spacer SP. That is, since both the dam D1 and the spacer SP include a layer formed of the same layers as the first interlayer insulating layer 160, the second interlayer insulating layer 180, and the partition wall 190, their structures are somewhat similar, but their functions are different. That is, the spacer SP has a similar height to the partition wall spacer 195 of the display area DA, and supports the mask in the process. However, the dam D1 has a higher height than the partition wall spacer 195 of the display area DA, and prevents an organic material from flowing.

An encapsulation layer 80 is disposed on the common electrode 730. The encapsulation layer 80 may be formed by alternately stacking at least one inorganic layer and at least one organic layer, and a plurality of inorganic layers or a plurality of organic layers may be provided.

In the illustrated exemplary embodiment, the encapsulation layer 80 includes a first inorganic encapsulation layer 810 and a second inorganic encapsulation layer 820, and an organic encapsulation layer 830 disposed between the first inorganic encapsulation layer 810 and the second inorganic encapsulation layer 820.

An additional plate 90 such as a touch part, a polarizer, or the like is disposed on the encapsulation layer 80, and an adhesive layer 900 may be disposed between the encapsulation layer 80 and the additional plate 90.

Although only the dummy electrode 177 is illustrated as being disposed under the spacer SP in FIG. 15, another structure disposed in the transistor of the display area DA may be further included under the spacer SP. That is, the semiconductor layer 135, the gate electrode 155, etc. may be further included. In addition, when the display area DA includes two or more source electrodes disposed in different layers, two or more source electrode layers disposed in different layers may be included under the spacer SP of the non-display area NDA.

Figure 16:
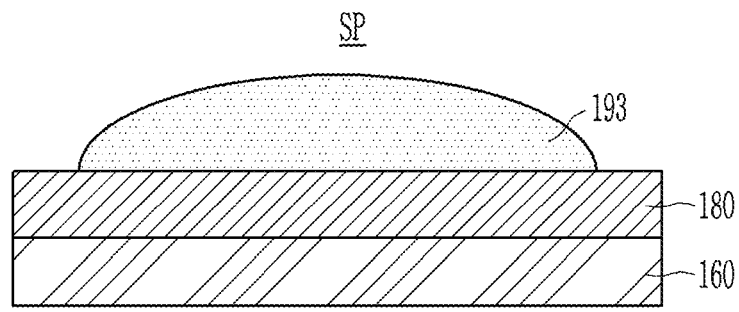
FIG. 16 is a schematic, cross-sectional view showing a stacked structure of a spacer according to a comparative example.
Figure 17:
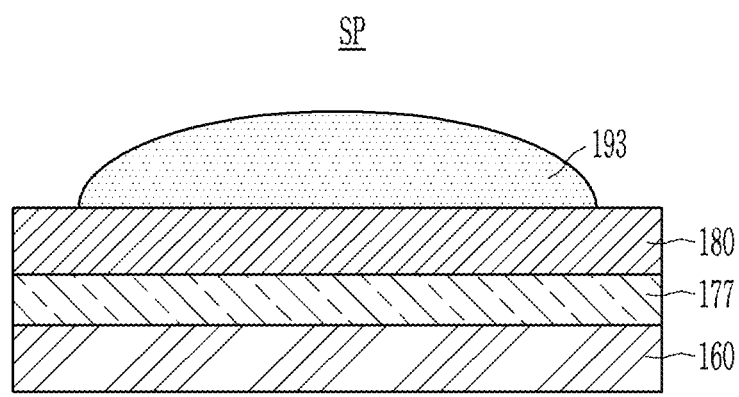
FIG. 17 to FIG. 19 are schematic, cross-sectional views of various stacked structures of a spacer according to an exemplary embodiment.
Figure 18:
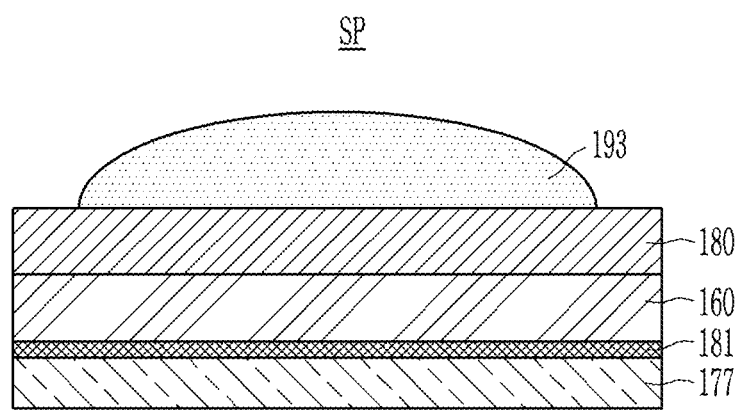
Figure 19:
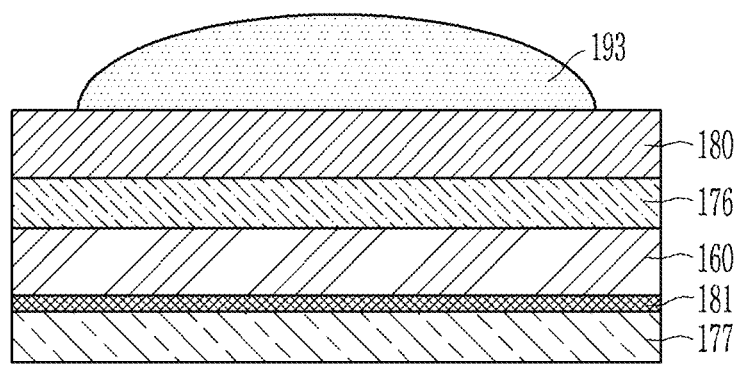

FIG. 16 is a schematic, cross-sectional view showing a stacked structure of a spacer SP according to a comparative example. FIG. 17 to FIG. 19 are schematic, cross-sectional views of various stacked structures of a spacer SP according to an exemplary embodiment.

Referring to FIG. 16, the spacer SP according to a comparative example includes the first interlayer insulating layer 160, the second interlayer insulating layer 180, and the spacer body 193. That is, since a structure of the dummy electrode 177 or any other transistor layer is not included in the lower portion of the spacer SP, the heights of the partition wall spacer 195 and the spacer SP of the display area DA are different from each other.

FIG. 17 to FIG. 19 are cross-sectional view of stacked structures of spacers SP according to various exemplary embodiments.

Referring to FIG. 17, the spacer SP according to the exemplary embodiment may include the first interlayer insulating layer 160, the dummy electrode 177, the second interlayer insulating layer 180, and the spacer body 193. In addition, the spacer SP may further include the buffer layer 120, the gate insulating layer 140, and the like under the first interlayer insulating layer 160.

Referring to FIG. 18, the spacer SP according to an exemplary embodiment may include the dummy electrode 177, a coating layer 181 that coats lateral surfaces of the source electrode and the drain electrode of the display area, the first interlayer insulating layer 160, the second interlayer insulating layer 180, and the spacer body 193. Referring to FIG. 18, the dummy electrode 177 is disposed at the lower portion of the spacer SP, and the first interlayer insulating layer 160 and the second interlayer insulating layer 180 are disposed to overlap the dummy electrode 177. In the spacer SP of the non-display area NDA, the stacked order of the dummy electrode 177, the first interlayer insulating layer 160, and the second interlayer insulating layer 180 may be changed according to the stacked order of the display area DA. That is, when the source electrode and the like are disposed under the first interlayer insulating layer 160 in the display area DA, the dummy electrode 177 may be disposed under the first interlayer insulating layer 160 in the spacer SP of the non-display area NDA.

The coating layer 181 is a layer surrounding the source electrode and the drain electrode in the display area DA. The coating layer 181 may coat the lateral surfaces of the source electrode and the drain electrode. The spacer SP of the non-display area NDA may include the coating layer 181.

FIG. 19 illustrates a spacer SP according to another exemplary embodiment. Referring to FIG. 19, the spacer SP according to the illustrated exemplary embodiment includes the dummy electrode 177 and an auxiliary dummy electrode 176 that are disposed at different layers. That is, referring to FIG. 19, the dummy electrode 177, the coating layer 181, the first interlayer insulating layer 160, the auxiliary dummy electrode 176, the second interlayer insulating layer 180, and the spacer body 193 are sequentially stacked. The auxiliary dummy electrode 176 may be disposed on the same layer as an ELVDD line in the display area DA. That is, while the ELVDD line of the display area DA is stacked, the auxiliary dummy electrode 176 may be formed by the same process as that for the ELVDD line.

The exemplary embodiments of FIG. 17 to FIG. 19 are merely examples, and the stacked structure of the spacer SP is not limited thereto. That is, the spacer SP may suitably include all or a part of the stacked structure of the display area DA.

Hereinafter, a display device according to another exemplary embodiment will be described with reference to the accompanying drawings.

Figure 20:
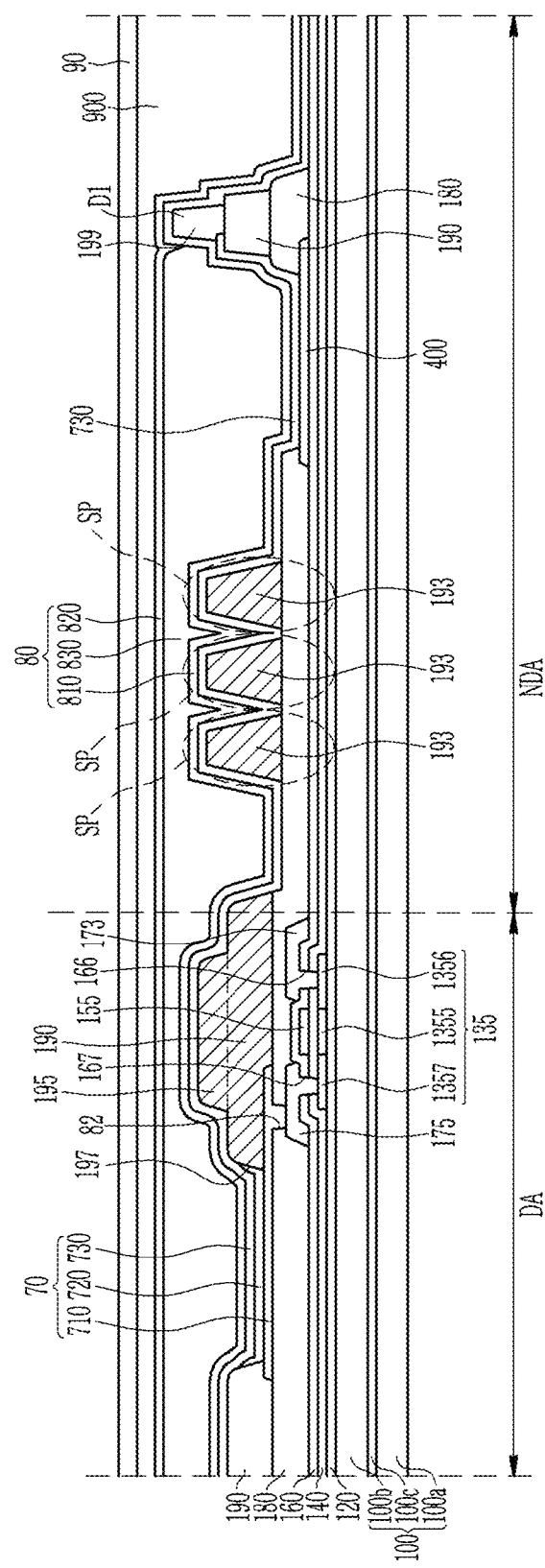
FIG. 20 is the same cross-sectional view as that of FIG. 15 in a display device according to another exemplary embodiment.

FIG. 20 is the same cross-sectional view as that of FIG. 15 in a display device according to another exemplary embodiment. Referring to FIG. 20, the display device according to the illustrated exemplary embodiment is substantially the same as the exemplary embodiment of FIG. 15 except for the stacked structure and the arrangement density of the spacers SP. Detailed description for the same constituent elements will be omitted to avoid redundancy.

Referring to FIG. 20, in the display device according to the illustrated exemplary embodiment, the dummy electrode is not disposed at the lower portion of the spacer SP. However, in the display device according to the illustrated exemplary embodiment, the arrangement density of the partition wall spacers 195 of the display area DA is higher than the arrangement density of the spacers SP of the non-display area NDA. That is, the partition wall spacers 195 of the display area DA are disposed on one or two of ten partition walls 190, while the spacers SP of the non-display area NDA may be disposed at a higher arrangement density. For example, the arrangement density of the spacers SP of the non-display area NDA may be 1.5 to 3 times the arrangement density of the partition wall spacers 195 of the display area DA.

When the arrangement density of the spacers SP of the non-display area NDA is high, it is possible to prevent stress from concentrating on the partition wall spacer 195 of the edge of the display area DA as shown FIG. 10.

Figure 21:
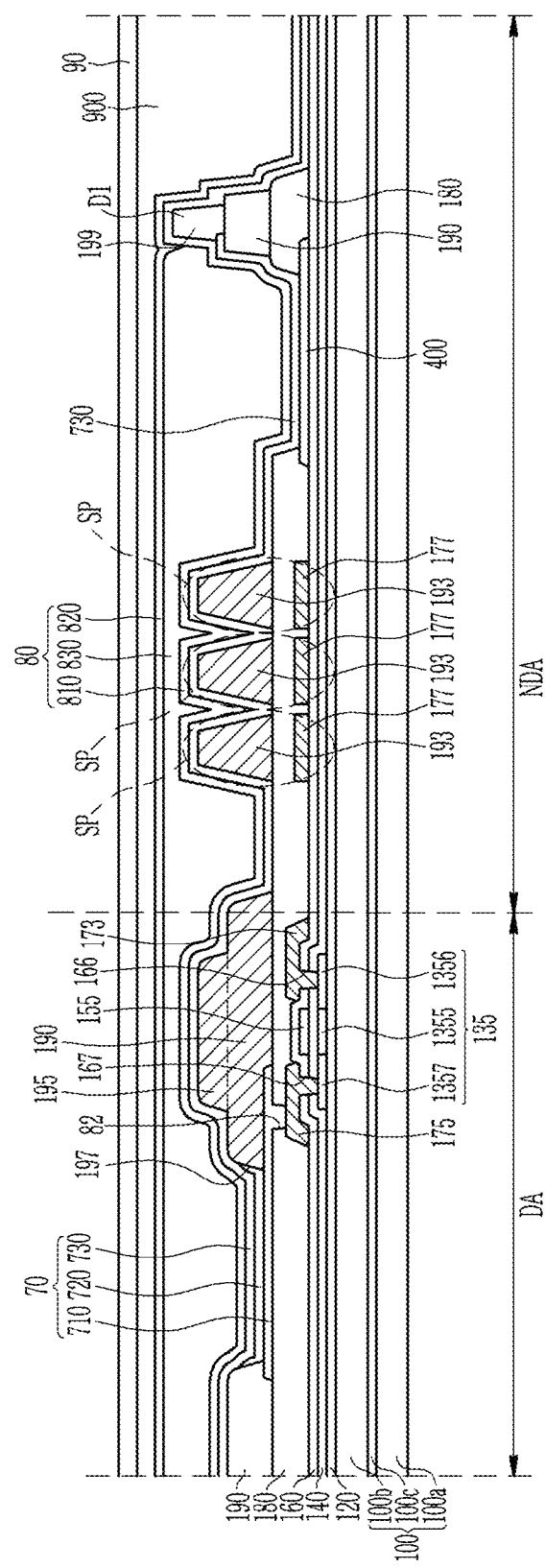
FIG. 21 is the same cross-sectional view as that of FIG. 15 in a display device according to another exemplary embodiment.

FIG. 21 is the same cross-sectional view as that of FIG. 15 in a display device according to another exemplary embodiment. Referring to FIG. 21, the display device according to the illustrated exemplary embodiment is substantially the same as the exemplary embodiment of FIG. 15 except for the arrangement density of the spacers SP. Detailed description for the same constituent elements will be omitted to avoid redundancy.

Referring to FIG. 21, the spacer SP of the display device according to the illustrated exemplary embodiment includes the spacer body 193, and the dummy electrode 177 overlapping the spacer body 193. In this case, the arrangement density of the spacers SP of the non-display area NDA is higher than the arrangement density of the partition wall spacers 195 of the display area DA. That is, the display device according to the exemplary embodiment of FIG. 21 is a combination of the display device of FIG. 15 and the display device of FIG. 20. That is, a specific structure of the display device according to the exemplary embodiment of FIG. 3 corresponds to the display device of FIG. 21. Referring to FIG. 21, since the display device according to the illustrated exemplary embodiment includes the dummy electrode 177 disposed at the lower portion of the spacer SP, a step between the spacer SP and the partition wall spacer 195 is minimized. In addition, since the arrangement density of the spacers SP of the non-display area NDA is higher than the arrangement density of the spacers SP of the display area DA, it is possible to prevent stress from concentrating on the partition wall spacer 195 disposed at the edge of the display area DA.

As described above, in the display device according to the exemplary embodiment, a part or all of the structure of the transistor layer TFT is included in the lower portion of the spacer SP of the non-display area NDA. Therefore, it is possible to minimize a step between the partition wall spacer 195 of the display area DA and the spacer SP of the non-display area NDA, and to minimize the stress applied to the partition wall spacer 195 of the display device. In addition, in the display device according to some exemplary embodiments, the spacers SP of the non-display area NDA are densely disposed at a higher arrangement density than the partition wall spacers 195 of the display area DA. Therefore, it is possible to disperse the stress applied to the partition wall spacers 195 of the display area DA.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate having a display area and a non-display area located at an outer periphery of the display area;
   a transistor disposed on the substrate;
   a plurality of partition walls disposed on the transistor in the display area;
   a light emitting element disposed between the partition walls; and
   a spacer disposed in the non-display area of the substrate, the spacer including a spacer body and at least a portion of the transistor.

2. The display device of claim 1, wherein
   the transistor comprises a source electrode and a drain electrode, and
   the spacer comprises a dummy electrode disposed in the same layer as the source electrode and the drain electrode.

3. The display device of claim 2, wherein
   the transistor further comprises a gate insulating layer, a first interlayer insulating layer, and a second interlayer insulating layer, and
   the spacer further comprises the gate insulating layer, the first interlayer insulating layer, and the second interlayer insulating layer.

4. The display device of claim 3, wherein
   the transistor further comprises a coating layer coating the source electrode and the drain electrode, and
   the spacer further comprises the coating layer disposed on the dummy electrode.

5. The display device of claim 1, wherein
   the transistor comprises two or more data conductors disposed on different layers, and
   the spacer comprises two or more data conductors disposed on different layers.

6. The display device of claim 1, wherein
   a plurality of partition wall spacers are disposed on some of the plurality of partition walls.

7. The display device of claim 6, wherein
   each of the plurality of partition walls and the plurality of partition wall spacers are formed from same material and are connected to each other.

8. The display device of claim 6, wherein
   a ratio of the partition walls at which the partition wall spacers are disposed among all of the partition walls is about 10% to about 20%.

9. The display device of claim 6, wherein
   the ratio of the height of the spacer to a sum of the heights of the partition wall and the partition wall spacer is about 0.7 to about 1.

10. The display device of claim 1, wherein
    the height of the spacer is about 3 µm to about 6 µm.

11. The display device of claim 1, wherein
    the spacer is disposed about 150 µm to about 200 µm apart from an edge of the display area.

12. The display device of claim 1, wherein
    the spacer body comprises the same material as the partition wall.

13. The display device of claim 1, further comprising
    a dam disposed in the non-display area, and
    the spacer disposed between the dam and the display area.

14. A display device comprising:
    a substrate having a display area and a non-display area located at an outer periphery of the display area;
    a transistor disposed on the substrate;
    a plurality of partition walls disposed on the transistor in the display area;
    a plurality of partition wall spacers disposed on some of the plurality of partition walls;
    a light emitting element disposed between the partition walls; and
    a plurality of spacers disposed in the non-display area of the substrate,
    wherein the spacers disposed in the non-display area are arranged at a density higher than a density at which the partition wall spacers disposed in the display area are arranged.

15. The display device of claim 14, wherein
    a ratio of the partition walls at which the partition wall spacers are disposed among all the partition walls disposed in the display area is about 10% to about 20%.

16. The display device of claim 14, wherein
    the arrangement density of the spacers disposed in the non-display area is about 1.5 to about 3 times the arrangement density of the partition wall spacers disposed in the display area.

17. The display device of claim 14, wherein
    the partition wall and the partition wall spacer comprise the same material and are connected to each other.

18. The display device of claim 14, wherein
    the spacer comprises a spacer body disposed in the same layer as the partition wall, and at least a portion of the transistor.

19. The display device of claim 18, wherein
    the transistor comprises a source electrode and a drain electrode, and
    the spacer comprises a dummy electrode disposed in the same layer as the source electrode and the drain electrode.

20. The display device of claim 19, wherein
    the transistor further comprises a gate insulating layer, a first interlayer insulating layer, and a second interlayer insulating layer, and
    the spacer further comprises the gate insulating layer, the first interlayer insulating layer, and the second interlayer insulating layer.

21. The display device of claim 14, wherein
    the ratio of the height of the spacer to a sum of the heights of the partition wall and the partition wall spacer is about 0.5 to about 1.

22. A display device comprising:
    a substrate having a display area and a non-display area located at an outer periphery of the display area;
    a transistor disposed on the substrate;
    a plurality of partition walls disposed on the transistor in the display area;
    a plurality of partition wall spacers disposed on some of the plurality of partition walls;

a light emitting element disposed between the partition walls; and a plurality of spacers disposed in the non-display area of the substrate, wherein the spacer includes a spacer body disposed in the same layer as the partition wall, and on at least a portion of the transistor, and the spacers are disposed in the non-display area at a higher density than a density at which the partition wall spacers are disposed in the display area.

23. The display device of claim 22, wherein the arrangement density of the spacers disposed in the non-display area is about 1.5 to about 3 times the arrangement density of the partition wall spacers disposed in the display area.

24. The display device of claim 22, wherein the transistor comprises a source electrode and a drain electrode, and the spacer comprises a dummy electrode disposed in the same layer as the source electrode and the drain electrode.

25. The display device of claim 22, wherein a ratio of a height of the spacer to a sum of heights of the partition wall and the partition wall spacer is about 0.7 to about 1.

* * * * *